United States Patent [19]

Sullivan

[11] Patent Number: 4,544,626
[45] Date of Patent: Oct. 1, 1985

[54] PHOTOPRINTING PROCESS AND APPARATUS FOR EXPOSING PHOTOPOLYMERS

[76] Inventor: Donald F. Sullivan, 115 Cambridge Rd., King of Prussia, Pa. 19406

[21] Appl. No.: 535,294

[22] Filed: Sep. 23, 1983

Related U.S. Application Data

[63] Continuation-in-part of Ser. No. 147,726, May 8, 1980.

[51] Int. Cl.⁴ ............................................. G03C 5/16
[52] U.S. Cl. .................................. 430/311; 430/327; 430/322; 430/494
[58] Field of Search ............... 430/327, 331, 322, 328, 430/494, 311, 319; 204/159.11; 427/53.1, 54.1

[56] References Cited

U.S. PATENT DOCUMENTS

| | | | |
|---|---|---|---|
| 3,573,975 | 4/1971 | Dhaka et al. | 430/327 X |
| 3,664,738 | 5/1972 | Cameron | 430/396 X |
| 3,723,120 | 3/1973 | Hummel | 430/327 |
| 3,746,541 | 7/1973 | Sharp | 430/311 |
| 4,148,934 | 4/1979 | Baker | 427/54.1 |
| 4,201,581 | 5/1980 | Thomas et al. | 430/323 X |
| 4,346,164 | 8/1982 | Tabarelli et al. | 430/327 X |

FOREIGN PATENT DOCUMENTS

| | | | |
|---|---|---|---|
| 57-10232 | 1/1982 | Japan | 430/327 |
| 58-52820 | 3/1983 | Japan | 430/311 |
| 1251751 | 10/1971 | United Kingdom | |
| 1512484 | 6/1978 | United Kingdom | |

OTHER PUBLICATIONS

W. S. DeForest, *Photoresist: Materials and Processes* (McGraw-Hill Inc., New York, 1975), pp. 20–33.
W. M. Moreau, "Proximity Printing Photomask", *IBM Technical Disclosure Bulletin*, vol. 14, No. 9, Feb. 1972, p. 2556.

*Primary Examiner*—John Kittle
*Assistant Examiner*—Cynthia Hamilton
*Attorney, Agent, or Firm*—Laurence R. Brown

[57] ABSTRACT

By exposing a photopolymer layer to radiation under the surface of a liquid medium such as water that does not affect the photopolymer solubility characteristic, disproportionately faster exposure time with lower energy cost and heat dissipation giving longer life to equipment and phototools and reducing production costs. The water additionally synergetically reacts as a coolant dissipating heat and as a release agent permitting photo bearing images to be in direct contact with the photopolymer while being radiated without accumulation of unwanted photopolymer to scratch the image or decrease its resolution.

14 Claims, 4 Drawing Figures

PHOTOPRINTING PROCESS AND APPARATUS FOR EXPOSING PHOTOPOLYMERS

BACKGROUND ART

This application is a continuation-in-part of the copending application Ser. No. 147,726 filed May 8, 1980 and to the extent necessary for background disclosure incorporates that application by reference.

TECHNICAL FIELD

This invention relates to a photoimaging process and apparatus for producing images of high fidelity on substrates, particularly the formation of conductor patterns on printed wiring boards, and the like, from photopolymers and particularly liquid photopolymers.

This disclosure teaches a new process and apparatus for producing graphic images on substrates, using photopolymers such as paste-consistency ultraviolet light (UV) curable liquid photopolymers. Liquid photopolymers are characterized by their composition of 100 percent reactive polymers, which are transformed from a pasteconsistency soluble wet film to an insoluble dry coating by exposure to a strong UV light source for several seconds. Other dry or insoluble photopolymers are made soluble by radiation. The photopolymers as used in the disclosed process are further characterized as being imaging quality, or capable of being selectively made soluble by light passing through a photographic master, thereby producing a film securely affixed to a substrate, at locations where the photographic master allows the UV light to impinge on the photopolymer. These photopolymers are available commercially as plating resists and as etch resists for use in printed wiring board (PWB) manufacture, for example. These photopolymers are also used extensively in graphic imaging and are being applied conventionally by screen printing.

In addition to screen printed images and dry film photoresist images, a third imaging method is known but not in widespread use, wherein PWB solder mask coatings are photoimaged by the Bell Laboratories. The process consists of roller coating the PWB surface with solder mask photopolymer, laminating a thin plastic sheet thereover and exposing the photopolymer through a phototool via a collimated light source. Use of atmospheric pressure to force the phototool into intimate contact with the thin plastic sheet would force or extrude the photopolymer into the drilled holes, and thins out the coating on the printed wiring. The thin plastic sheet also separates the emulsion of the phototool from the surface of the photopolymer so that loss of fidelity is experienced because of light undercutting.

In my U.S. Pat. No. 4,260,675, I describe a process of applying PWB solder mask using liquid UV-curable photopolymers wherein the PWB is coated overall by screen printing, and a glass plate phototool having opaque projections is placed on the PWB in register so that the opaque projections register with circuit pads that are not to receive solder mask. The assembly is vacuumed down for intimate contact and conveyed past mercury-vapor lamps to photoharden the light-struck areas. After exposure the remaining liquid photoresist is washed out in a solvent spray bath.

The glass phototool assembly experiences a temperature rise from repititious use, for the solder mask photopolymer thickness is of the order of 0.005 inches and to cure down to the base laminate an energy density of 6 joules per square centimeter is required. To some degree, the photoresist is air inhibited, even though a vacuum of 20 inches of mercury is used. The temperature build-up is typically up to 200 degrees F.

Another application for photopatterning liquid photopolymers is practiced by the W. R. GRACE COMPANY in their ACCUTRACE system. A plating resist is photopatterned onto PWB by off-contact exposure using a collimated light source. An off-contact separation distance of the order of 0.007 inches circumvents the problems associated with phototool contact with the liquid resist, but at a sacrifice in resolution, since light undercutting is experienced even with a collimated light source.

In my copending parent patent application U.S. Ser. No. 147,726 filed May 8, 1980, I describe a process for photopatterning photopolymer layers on copper-clad substrates, in which the phototool is coated with a liquid photopolymer, then cojoined with the PWB so as to preclude air. This disclosure teaches the use of a liquid coolant dispenser on the external surface of the phototool as a method for preventing excessive temperature build-up.

Another known technique for circumventing the oxygeninhibition effects on photocurable polymers includes the use of a nitrogen blanket within the UV reactor, or conveyorized UV-curing unit. The LINDE division of UNION CARBIDE manufactures a UV reactor in which nitrogen displaces air in the exposure volume, resulting in the reported ability to reduce lamp power significantly while maintaining curing speed and cured film thickness. The use of nitrogen, however, is expensive, for losses must be constantly replaced.

Another known method for excluding air is to overlaminate the photopolymer-coated substrate with a clear plastic film. This process is not readily adaptable to the photoformation of solder masks on printed wiring boards for several reasons. First, the rough surface topography presented by raised printed wiring conductors makes it difficult to overlaminate a thin plastic sheet without air entrapment and without the liquid photopolymer being extruded from the top surfaces of narrow conductors and producing areas of uneven photopolymer thickness.

Referring again to U.S. Pat. No. 4,260,675 which discloses a glass plate phototool with stand-off projections contacting the PWB during the exposure of a printed wiring board solder mask, the applicant sought for a method to overcome the effects of light absorption of the glass plate phototool and the reduction of cured photopolymer thickness resulting therefrom. The most obvious solution is to increase the exposure time, but this approach reduces the rate of production to an unacceptable level. Further, by increasing exposure time, the total energy received by the phototool and the PWB assembly increases as does the assembly temperature, making handling difficult and slower. Additionally, the heat rise causes the substrate to change dimensions appreciably.

To summarize the prior art in wet photoresist photopatterning, each method is seen to have one or more shortcomings in achieved resolution, production speed, and phototool temperature rise after repetitive use.

One objective of the disclosed photopatterning process is the achievement of fine lines and spaces using an uncollimated light source, by having intimate contact between the phototransparency and the wet photoresist.

A second objective is a photopatterning process in which all photoresist remains on the printed wiring substrate and none offsets onto the phototransparency. Should offsetting occur, then two remedies would be required. First, if hardened photoresist should adhere to the phototransparency in clear areas then a releasing surface would be required, at some expense and some sacrifice in resolution. Second, if liquid photoresist should offset in opaque areas, then a cleaning step would be required after each cycle.

Another objective is to significantly reduce the light energy required by removing all air from the photoresist surface during exposure.

Another objective is to reduce the thermal buildup in the phototransparency assembly from repetitive use, and to thereby achieve improved dimensional accuracy.

DISCLOSURE OF THE INVENTION

A photoresist coating is applied to a PWB at a high rate of speed and with a high degree of precision on a production basis by immersing the coated PWB and the phototool in a liquid medium that does not affect photopolymer solubility, preferably an aqueous solution, and exposing the photoresist while in the liquid medium.

A conventional glass plate phototransparency is prepared having opaque areas corresponding to PWB locations which are not to receive photocured resist.

A UV-curing unit simply comprises a shuttle conveyor conveying a tray carrying water under which a photopolymer coated substrate such as a PWB is carried past the UV lamps. The PWB is coated uniformly with a photopolymer of known composition. Coating is accomplished by screen printing using a blank screen, or one without a stencil, so as to place photopolymer on all PWB surfaces, including land areas. The coated PWB is placed in the tray containing water, and all air is immediately displaced from the photopolymer surface. No significant chemical reaction takes place between the water and liquid photopolymer.

Next, the glass plate phototransparency is placed atop the coated board in register and on contact and conveyed past the tubular mercury-vapor lamps at a speed of the order of 15 feet per minute, hardening lightstruck areas. The assembly is removed, the phototool separated from the PWB, and the PWB is then subjected to a solvent spray bath to washout unexposed photopolymer.

The disclosed process is amenable to photoimaging plating and etch resists and solder masks on printed wiring boards.

The disclosed process is also useful in curing photopolymer on fragile substrates which are coated and then cured by UV light exposure, especially temperature-sensitive substrates like polyester film.

BRIEF DESCRIPTION OF THE DRAWINGS

Further background, objects, advantages and features of the invention will be set forth throughout the following specification with reference to the accompanying drawings wherein.

THE PREFERRED EMBODIMENT

Figure 1:
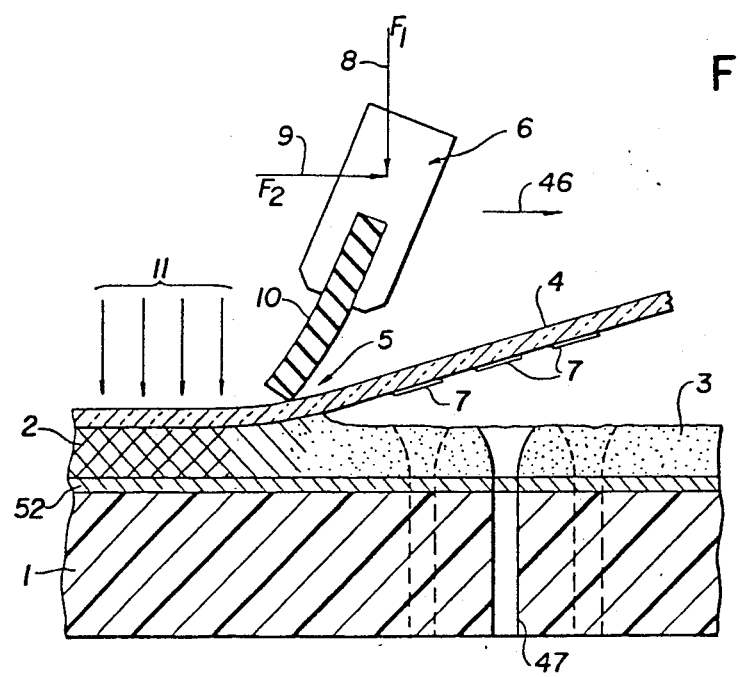
FIG. 1 is a diagrammatic side view sketch, partly sectioned to illustrate the mating of a photo image with a coated substrate by use of a resilient blade as provided by this invention.

FIG. 1 shows a section of a PWB 1 in which the phototool is being mated to the coated surface 3. PWB 1 has been previously roughly coated with photopolymer layer 3. Phototool 4 is positioned above and off contact with PWB 1 with opaque areas 7 registered to drilled holes 47 in the PWB 1. Assembly 6 movable in the direction of arrow 46 has rubber blade 10 of 50 durometer, which traverses the top surface of phototool 4. Force $F_1$ in direction 8 on phototool 4 causes the phototool to contact the photopolymer and force $F_2$ in the direction of movement 9 causes blade 10 to traverse the topside of the phototool and progressively mate the phototool with the photopolymer.

This technique purges the photopolymer of air bubbles which may have been entrapped during the coating cycle, and also prevents the entrapment of air resident between the phototool and photopolymer surface.

This mating technique has several highly desirable features not readily obtainable otherwise. First, the photopolymer surface, when coated, may be mottled or have an orange-peel effect. These surface irregularities are smoothed out and the mated surface conforms to the smooth plastic surface topology of phototool 4 as well as the substrate. In the case of a PWB the substrate carries a copper layer 52 surface which is to be conformed to the image of the phototool 4, for example. This is illustrated in FIG. 1 with crosshatched photopolymer area 2 being in surface to surface contact because of the previous scanning of surface contact member 10, preferably a rubber blade, across the phototool 4 surface.

While this mating technique smoothes out surface irregularities, there is no tendency for the photopolymer to be forced out ahead of the blade and thereby reduce the coating thickness.

At the point 5 where the blade edge contacts the phototool, the instantaneous pressure may reach 300 pounds per square inch (2067 kPa). This high pressure causes any trapped air bubbles to burst and the air is forced out ahead of the blade.

On those areas of the phototool now mated with the (crosshatched) photopolymer, a strong holding force is maintained between the phototool and PWB surface. Thus, atmospheric pressure 11 (FIG. 1) maintains the phototool in intimate contact with the photopolymer surface indefinitely, without an outside vacuum source. Phototool opaque areas 7 (which usually do not constitute surface irregularities) are in intimate contact with the photopolymer surface, and the photopolymer can be exposed with a non-collimated light source and produce high fidelity reproduction of images on the phototool on the PWB plating resist pattern.

Figure 2:
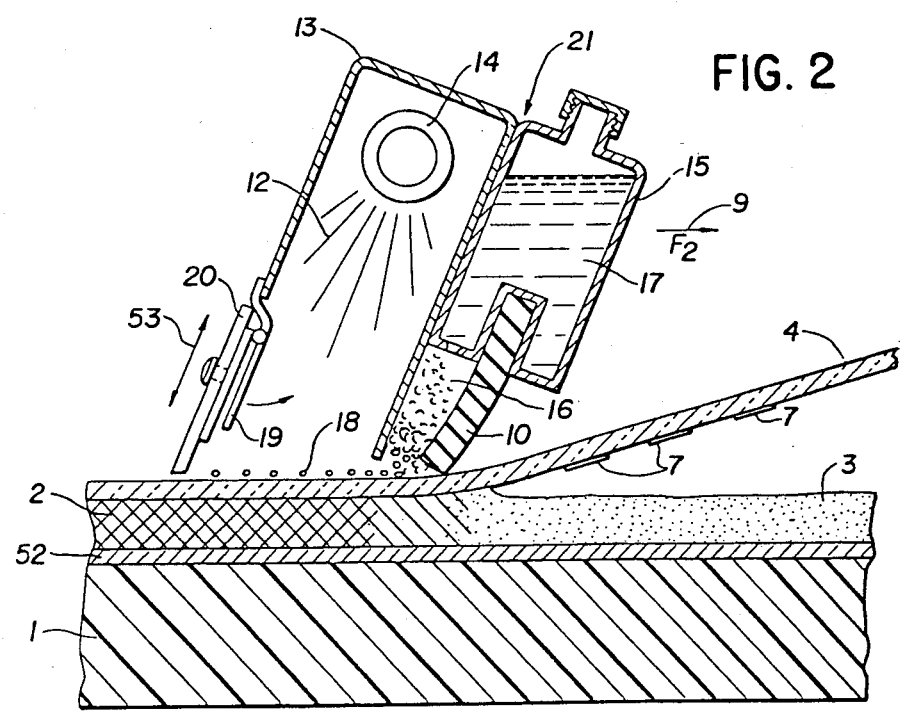
FIG. 2 is a further similar sketch illustrating the mating during an exposure step wherein a coolant dispenser and tubular lamp are co-mounted to protect the photo image from excess heat and expose the photopolymer all on one scan.

FIG. 2 shows a preferred method for curing photopolymer 3. For this purpose, UV lamp 14 and reflector-focuser 13 are mounted on the same movable transversing assembly 21 as blade 10. After the blade causes the phototool to mate with the photopolymer, light rays 12 expose and polymerize the photopolymer layer 2 directly beneath the phototool transparent areas. Light rays 12 cannot expose those areas ahead of blade 10.

FIG. 2 shows the coolant dispensing apparatus, reservoir 15, supplying coolant 17 to sponge 16 and thence to phototool 4 in a film shown as droplets 18. Shuttering is accomplished automatically by pivoted shutter 19 as the assembly 21 is lowered into contact with phototool 4. Light shroud 20 contacts phototool 4 and slides upward along the reflector-focuser 13, and actuates the pivoting shutter 19 which opens to expose the mated photopolymer. Arrow 53 shows the reciprocal movement of the transversing assembly to move from rest into engagement on transversal and then back into a spaced separation position from the photopolymer layer 3.

FIG. 2 shows 3 distinct zones or conditions of photopolymer. Photopolymer 2 under lamp 14 is polymerized as shown by crosshatching, while photopolymer 2 under sponge 16 is under vacuum but not yet exposed as indicated by lining; photopolymer 3 is not yet contacted by phototool 4 and is therefore at atmospheric pressure as indicated by dotting. The preferred solder mask photopolymer is the "TYPE 311LV" available from M & T CHEMICALS, INC. of Rahway, N.J. The "TYPE CNF 1110" manufactured by M & T CHEMICALS, INC. of Rahway, N.J. is the preferred photoresist for use as both plating and etch resist in primary imaging.

Representative photoresists and manufacturers are listed below:

| Manufacturer | Product Code | Description |
| --- | --- | --- |
| W. R. Grace Corp. Columbia Md. | SPR 7263 LR APR 7263 M | Plating Resist Etch Resist |
| Dynachem Corp. Tustin, Calif. | SR 30 H | Screen Resist |
| Mac Dermid Corp. Waterbury, Conn. | 9403 | UV Plating Resist |
| Colonial Printing Ink E. Rutherford, N.J. | UV 50-48 | Solder Mask |
| Advance Processing & Supply Corp. Chicago, Ill. | UVAL | Graphics Imaging UV Curable Photopolymer |

These photoresists have been developed to be screen printed to a thickness of 1 to 2 thousandths of an inch (0.025 mm to 0.05 mm), and cured by a two-lamp assembly, each lamp rated at 200 watts per linear inch (2.54 cm), with a conveyor speed of 12 feet per minute. With the disclosed equipment the phototool is placed between the lamp and PWB, subjecting the phototool to temperature ranging up to 300 degrees F. While the phototool temperature can be reduced to less than 100 degrees F. by utilizing a different lamp source and increasing the exposure time to the order of 40 seconds, the preferred embodiment is the use of polyester sheet and a high temperature silicone rubber layer to bond the opaque areas 7 (FIG. 1) to the sheet 4; and the use of a liquid coolant on the surface of the sheet.

This disclosure teaches a way of introducing a liquid coolant. One embodiment as in FIG. 2 puts a film of coolant onto the phototool surface at the trailing edge of the mating blade. A 50 percent water-alcohol solution is applied across the width of the phototool by a sponge. While many liquids can be used, it is necessary that the phototool be wetted completely and beading of coolant prevented. The coolant absorbs heat from the phototool by evaporation, yet does not significantly reduce the transmittance of the UV light energy. The alcohol-water solution will keep the phototool temperature to 200 degrees F. or lower.

As shown in FIG. 2, reservoir 15 contains the coolant solution, which is applied to phototool 4 by sponge 16. When two successive lamps are used, coolant film shown as droplets 18 is partially evaporated by the first lamp 14, and remains in diminished quantity to provide phototool cooling when passing under the second UV lamp.

The apparatus and procedures disclosed herein can also be used to image PWB using dry film photoimaging resists as manufactured by the Du Pont Company and others. The following "Du Pont" photopolymers are representative of those which can be mated and exposed as described herein: TYPE 6; 1105; 1010; X1135; 1020 and 310.

Using the disclosed mating and exposing apparatus, the resolution of dry film images can be significantly improved. This increased resolution is achieved by removing the protective polyester sheet which covers the dry film photopolymer prior to exposure. The manufacturer recommends leaving the polyester film in place during exposure and up to the time of development. However, the film, being 0.75 mils (0.019 mm) thick separates the phototool emulsion from the photopolymer surface during exposure and results in loss of image fidelity. When the cover sheet is removed, the unexposed dry film is tacky to the point that a phototool cannot be placed on the photopolymer and moved about to achieve register.

Figure 3:
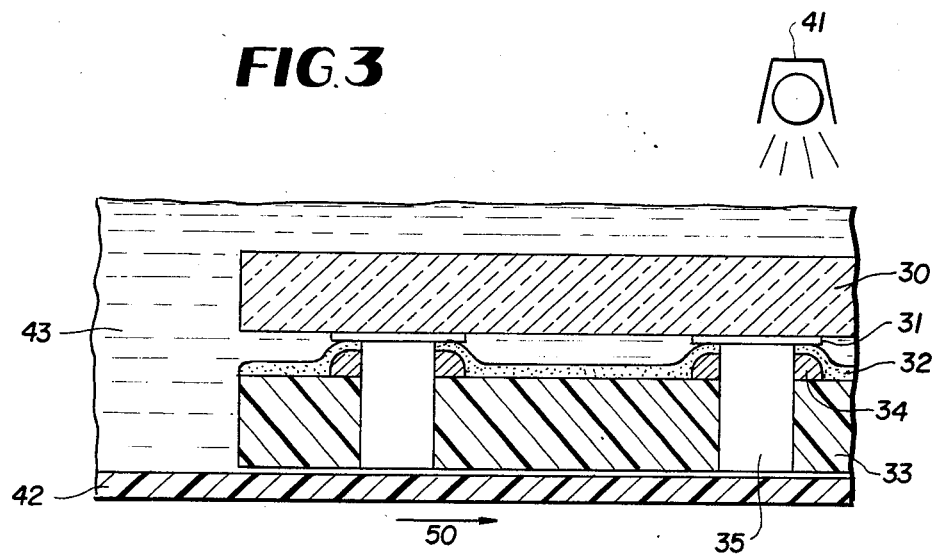
FIG. 3 is a perspective sketch of a fixture for disposing a PWB through a photo image in register therewith in a tray under water relatively movable to receive radiation from UV lamp sources.

For a preferred liquid cooling and photopolymer exposure process and corresponding instrumentation, consider the sketch of FIG. 3.

A transparent glass plate phototool 30 is prepared having opaque areas 31 on a clear field, with opaque areas 31 corresponding to locations on the printed wiring board to be free of hardened photopolymer with the liquid negative acting photopolymer layer 32. A suitable glass plate with photoemulsion thereon is sold by EASTMAN KODAK COMPANY. Alternatively, a polyester phototransparency can be adhered to a glass plate of the order of 0.2 inches (0.5 cm) thick, so as to exclude and prevent reentry of air therebetween.

The printed wiring board 33 is coated overall by screen printing a photopolymer layer 32 having a thickness of the order of 0.001 (0.0025 cm) inches, the actual thickness being largely determined by the screen printing fabric used. Typically, a 110-mesh polyester screen will deposit a layer 0.00125 inches (0.003 cm) thick. A blank screen is used to coat the printed wiring board 33 overall: base laminate, conductors, and circuit pads. The preferred solder mask photopolymer is the "TYPE 311LV" available from M & T CHEMICALS, INC. of Rahway, N.J.

A UV-curing unit 41 is a suitable exposure source. Two tubular mercury-vapor lamps, each rated at 200 watts per linear inch will expose the solder mask coating 32 at a conveyor speed 36 (FIG. 4) of the order of 10 feet per minute. A suitable UV-curing unit is made by ARGUS INTERNATIONAL of Hopewell, N.J.

The coated printed wiring board 33 is placed in a tray 42 containing an aqueous solution 43 having a depth of approximately 1 inch. By placing the circuit board 33 in the water all air is thereby immediately purged from the photopolymer layer 32 surface, and also purged from small irregularities in the photopolymer coating, through-holes, and slots. The glass plate phototool 30 is placed in the water and positioned over the PWB in register and lowered onto the PWB surface. At this point, the emulsion 31 of the phototool 30 is in intimate contact with the wet photopolymer 32 on the circuit board 33 traces, while the glass surface elsewhere may be separated by approximately 0.004 inch (0.01 cm) from the photopolymer covering the base laminate. Base laminate 33 has metal conductors 34 and circuit holes 35. Photopolymer layer 32 uniformly coats the top surface of base laminate 33 and metal conductors 34. Phototool 30 with opaque emulsion areas 31 rests on the PWB so that the emulsion 31 of phototool 30 is in contact with photopolymer layer 32. Water 43 fills the volume between the photopolymer surface and the lower edge of phototool 10 so that all air is displaced.

The tubular mercury-vapor lamp and focuser-reflector array 41 directs UV light onto photopolymer 32 through aqueous layer above the phototool and below the phototool. Tray 42 is relatively moved in direction 50 to convey all areas of photopolymer 32 past UV lamp 41.

After exposure the phototool 30 and PWB 33 are removed from the tray and separated. All photopolymer, both hardened and unexposed, remains on the PWB 33, and none adheres to the phototool 30.

The solder mask coating is completed by spraying a solvent on the PWB 33 to wash out unhardened photopolymer. A suitable solvent is a mixture of 85 parts by volume of trichloroethane and 15 parts by volume of isopropyl alcohol. A suitable equipment for spray developing the unhardened photopolymer is the DU PONT "A" PROCESSOR, using a cycle time of the order of 20 seconds.

Thus far, the process prepares a solder mark layer by leaving cured and hardened photopolymer from layer 32 on the surface of PWB 33. Primary imaging refers to the photopatterning of a resist, either a plating resist or an etch resist to form the basic conductor patterns on the base laminate. The disclosed process is similarly advantageous for primary imaging. The equipment and processes are the same as detailed hereinbefore for solder making, with the exception of the photopolymer. The "TYPE CNF 1110" manufactured by M & T CHEMICALS, INC. of Rahway, N.J. is the preferred photoresist for use as both plating and etch resist in primary imaging.

The composition of aqueous solution 43 can be varied in accordance with the specific photoresist used and the desired results. As previously described, it is important that all photoresist remains on the printed wiring substrate and that the phototransparency remain free of either hardened or liquid photoresist. With the type "311 LV" solder mask photopolymer, the addition of a liquid detergent to the aqueous solution will prevent offsetting, and the phototransparency will remain free of photoresist. The mixture ratio is of the order of one ounce of detergent per gallon of water.

The photospeed of the photoresist is improved beyond that obtained by simply displacing oxygen from the photopolymer surface. Furthermore, the addition of a small quantity of acetic acid to the aqueous solution has been observed to increase the photospeed beyond the increase achieved by water alone.

As used herein, photocuring is differentiated from photopatterning in that photocuring is non-selective hardening of photopolymer which has been coated in the desired patterns. For example, the same photoresists cited earlier in this specification, the type "311 LV" solder mask and "CNF 1110" imaging resist, can be imaged onto a substrate by screen printing the desired pattern and photocuring. When temperature-sensitive substrates such as polyester film are used, then their immersion in an aqueous solution while being exposed will prevent overheating and warping, and the conveyor speed can be increased compared to photocuring in air. The water 43 acts as a coolant, a release agent and a medium to increase photospeed.

The disclosed process, materials, and equipment provides a number of improvements in the art of printed wiring board manufacturing. These improvements are:

(1) Improved resolution of photopatterns achieved by intimate contact between phototool emulsion and photoresist on printed wiring land areas.

(2) Prevention of unwanted transfer of liquid photoresist from coated PWB to phototool when the phototool rests on the liquid photoresist surface, obviating the need for a release surface on the phototool, and obviating the need to periodically clean the phototool to remove photoresist.

(3) A reduction of the operating temperature of the phototool assembly thereby reducing misregistration caused by thermal expansion of the substrate.

(4) A reduction in lamp power required to photo harden a given thickness, or conversely, with a given lamp power the conveyor speed can be increased significantly while still photohardening a given thickness.

Figure 4:
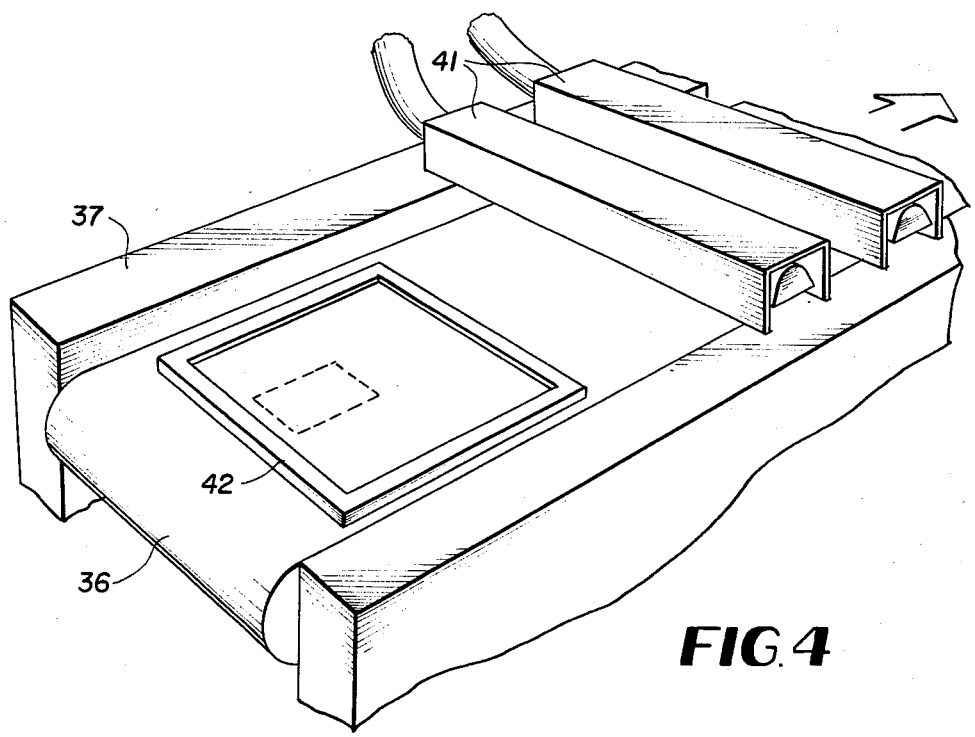
FIG. 4 is a perspective fragmental view of a simple unit for exposing a photopolymer containing water tray in accordance with the invention.

An article such as PWB 33 with an uppermost photopolymer layer 32 placed in fixture 42 can be placed on conveyor belt 36 of the exposing unit 37 in FIG. 4 having UV lamps 41 with conveyor belt 36 for moving substrates under the lamps. Clearly this invention has simplified such exposing instrumentation since only container 42 with water therein is needed to dispose the photopolymer under a liquid solution during exposure in accordance with the process taught by this invention.

The use of a conveying type UV-curing unit 37 as an exposure source has two advantages. First, it permits a much higher rate of production, for many different types of images can be exposed sequentially with no UV curing unit changes. This allows a large production facility to coat the PWB with photopolymer put into a tray 42, mate the phototool when used, and to expose with a single high speed curing unit.

The second attribute of the use of UV curing unit is that substrates of exceptional length can be mated and exposed, obviating the need for oversize cabinetry.

Having therefore set out the construction and operation of a preferred embodiment of the invention and advanced the state of the art, these features of novelty believed descriptive of the spirit and nature of the invention are set forth with particularity in the appended claims.

I claim:

1. The process of radiating the surface of a photopolymer layer through a phototool comprised of a thin flexible substrate carrying an image having an inner surface disposed toward the photopolymer and an outer surface disposed toward a radiation source to expose portions of the photopolymer layer corresponding to said phototool image with enough radiation to produce a change of photopolymer solubility, wherein heat from the radiation is dissipated to prevent undesirable distortion of said thin flexible phototool substrate by the heat and temperature rise, comprising the steps of excluding gas and air from the surface of the photopolymer layer to reduce the amount of radiation necessitated to change the photopolymer solubility by means of covering the photopolymer surface during radiation with a removable non-gaseous body transparent to said radiation, and dissipating heat generated by the radiation in the photopolymer layer and the thin flexible phototool during the exposure by disposing water in thermal contact with the photopolymer layer and disposing water on the outer surface of the phototool to thermally dissipate heat from that surface during radiation.

2. The process defined in claim 1 wherein the photopolymer layer is of a liquid photopolymer hardened when exposed to said radiation.

3. The process defined in claim 1 including the step of excluding gas and air by contacting the photopolymer layer with a body of said water surrounding the phototool to serve as said body transparent to radiation, whereby the body of water also comprises the said water disposed in thermal contact to dissipate heat.

4. The process of claim 3 wherein the water body is a water solution having an detergent additive.

5. The process of claim 3 wherein the phototool is an image bearing body including the steps of passing said phototool, through the liquid into contact with the photopolymer layer before radiating thereby to expose a pattern corresponding to the photo image, and cooling the image bearing body with said liquid.

6. The process of claim 5 including the step of adding detergent to the liquid solution as a release agent thereby further preventing polymer from the polymer layer from adhering to the image bearing body.

7. The process of claim 1 including the steps of forming the phototool with a photo image on a thin plastic film and repeatedly using this phototool to image patterns on a succession of photopolymer layers.

8. The process of claim 1 including the step of putting a substrate carrying said layer of photopolymer into a liquid holding vessel under the surface of a liquid and passing the vessel past a radiation source at a movement rate permitting exposure of the photopolymer layer.

9. The process of claim 8 including the step of registering on said layer said phototool by passing it through said liquid.

10. The process of claim 8 wherein the substrate comprises a printed wiring board.

11. The method of dissipating thermal energy induced by radiation during an imaging step in the phototool through which radiation is passed to change the solubility of at least designated portions of a thin photopolymer layer by radiation through the phototool defining a pattern comprising the steps of covering both the photopolymer layer and phototool with a body of water and passing enough radiant energy from a radiation source through the water and phototool onto the photopolymer layer to thereby change the solubility thereof while dissipating thermal energy induced in the photopolymer and phototool by the radiation into the body of water.

12. The method of claim 11 including the steps of adding a detergent to the water to improve the release characteristics between the image bearing member and the polymer surface when in contact therewith, and placing said image bearing surface into contact with said photopolymer layer by passing it through the water onto the photopolymer layer positioned under the water.

13. The method of claim 11 wherein the liquid is a water solution including a detergent additive.

14. The method of exposing a photopolymer layer to radiation through a phototool located under the surface of a heat dissipating liquid medium thereby to change the solubility characteristics of at least a part of the photopolymer layer by radiation energy while dissipating into the body of water thermal energy induced in the phototool by said radiation.

* * * * *